United States Patent
Hatakeyama et al.

(10) Patent No.: US 7,241,553 B2
(45) Date of Patent: Jul. 10, 2007

(54) POLYMER, RESIST COMPOSITION, AND PATTERNING PROCESS

(75) Inventors: Jun Hatakeyama, Joetsu (JP); Yuji Harada, Joetsu (JP); Yoshio Kawai, Joetsu (JP); Masaru Sasago, Hirakata (JP); Masayuki Endo, Izumi (JP); Shinji Kishimura, Itami (JP); Kazuhiko Maeda, Tokyo (JP); Haruhiko Komoriya, Kawagoe (JP); Kazuhiro Yamanaka, Kawagoe (JP)

(73) Assignees: Shin-Etsu Chemical Co., Ltd., Tokyo (JP); Matsushita Electric Industrial Co., Ltd., Osaka (JP); Central Glass Co., Ltd., Ube (JP)

( * ) Notice: Subject to any disclaimer, the term of this patent is extended or adjusted under 35 U.S.C. 154(b) by 0 days.

(21) Appl. No.: 11/051,721

(22) Filed: Jan. 27, 2005

(65) Prior Publication Data

US 2005/0221221 A1  Oct. 6, 2005

(30) Foreign Application Priority Data

Jan. 30, 2004  (JP) ............................... 2004-023724

(51) Int. Cl.
*G03F 7/039* (2006.01)
*G03F 7/30* (2006.01)
*C08F 18/20* (2006.01)
*C08F 118/00* (2006.01)
*C08F 120/22* (2006.01)

(52) U.S. Cl. .................. 430/270.1; 430/326; 430/907; 430/910; 526/245; 526/246

(58) Field of Classification Search ............ 430/270.1, 430/907, 910, 326; 526/245, 246
See application file for complete search history.

(56) References Cited

U.S. PATENT DOCUMENTS

| 6,919,161 | B2 * | 7/2005 | Hatakeyama et al. .... 430/270.1 |
| 2001/0010890 | A1 * | 8/2001 | Hatakeyama et al. .... 430/270.1 |
| 2001/0018162 | A1 * | 8/2001 | Hatakeyama et al. .... 430/270.1 |
| 2001/0033989 | A1 * | 10/2001 | Harada et al. ........... 430/270.1 |
| 2002/0161148 | A1 * | 10/2002 | Harada et al. ............... 526/242 |
| 2003/0165773 | A1 * | 9/2003 | Harada et al. ........... 430/270.1 |

FOREIGN PATENT DOCUMENTS

| JP | 63-27829 A | 2/1988 |
| JP | 2-27660 B2 | 6/1990 |
| JP | 9-73173 A | 3/1997 |
| JP | 9-230595 A | 9/1997 |
| JP | 10-10739 A | 1/1998 |
| WO | WO-97/33198 A1 | 9/1997 |

OTHER PUBLICATIONS

Azuma et al., Proceedings of SPIE vol. 3999 (2000), pp. 264-269.
Kwong et al., Proceedings of SPIE, vol. 3678, pp. 1209-1214 (Mar. 1999).
Bae et al., Proceedings of SPIE, vol. 5039 (2000), pp. 665-671.
Hatakeyama et al., Proceedings of SPIE, vol. 5039 (2003) pp. 672-681.

* cited by examiner

*Primary Examiner*—Richard L. Schilling
(74) *Attorney, Agent, or Firm*—Birch, Stewart, Kolasch & Birch, LLP

(57) ABSTRACT

A chemically amplified resist composition using an alternating copolymer of α-trifluoroacrylic acid with norbornene as a base polymer lends itself to ArF laser lithographic micropatterning and is improved in transparency, plasma etching resistance, and line edge roughness.

16 Claims, No Drawings

POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2004-023724 filed in Japan on Jan. 30, 2004, the entire contents of which are hereby incorporated by reference.

This invention relates to a resist composition suited for micropatterning technology. More particularly, it relates to a polymer useful as a base polymer in such resist compositions, a chemically amplified resist composition comprising the same, and a patterning process using the resist composition.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemically amplified positive working resist materials that utilize as a catalyst the acid generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography. Also, the change-over from i-line (365 nm) to shorter wavelength KrF excimer laser (248 nm) brought about a significant innovation. Resist materials adapted for KrF excimer lasers enjoyed early use on the 0.30 micron process, proceeded through the 0.25 micron, 0.18 micron and 0.13 micron rules, and currently entered the mass production phase on the 0.09 micron rule. Engineers have started investigation on the 0.065 micron rule, with the trend toward a finer pattern rule being accelerated.

An ArF excimer laser (193 nm) is expected to enable miniaturization of the design rule to 0.13 μm or less. Conventional novolac resins and polyvinylphenol resins cannot be used as the base resin for ArF excimer laser resists because they have very strong absorption in proximity to 193 nm. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

For the ArF resists, substantial line edge roughness is also considered problematic. It is described in Proc. SPIE, Vol. 3999, p. 264 (2000), for example, that image contrast is in inverse proportion to line edge roughness. The higher the light contrast, the less becomes the line edge roughness. For example, increased NA of lens, application of modified illumination or phase shift mask, or wavelength reduction allows the light contrast to be increased and the line edge roughness to be reduced. The wavelength reduction from KrF to ArF excimer laser is expected to reduce line edge roughness. In fact, however, it was reported that ArF resists have greater line edge roughness than KrF resists. This is attributable to the difference in performance between ArF and KrF resists, and remains to be one of outstanding problems for ArF resists. Another problem is that ArF resists have weak etching resistance as compared with KrF resists. In particular, a problem that roughness is developed on the surface after etching and transferred to the substrate as striations is pointed out in Proc. SPIE, Vol. 3678, p. 1209 (1999) and Proc. SPIE, Vol. 5039, p. 665 (2003). It is also reported in Proc. SPIE, Vol. 5039, p. 672 (2003) that a resist using an alternating copolymer as the base forms a pattern with minimal edge roughness after development. The alternating copolymer in which the arrangement of recurring units is controlled to the molecular level is characterized by its ability to minimize edge roughness.

SUMMARY OF THE INVENTION

An object of the invention is to provide a novel polymer useful as a base polymer in a resist composition, especially chemically amplified resist composition, having improved transmittance to deep UV radiation of up to 300 nm, especially of ArF (193 nm); a resist composition comprising the same; and a patterning process using the composition.

The inventor has discovered that the use of a copolymer of an acrylate monomer containing fluorine at alpha-position with a norbornene derivative as a base polymer enables to formulate a chemically amplified resist composition having improved resolution and dry etching resistance and minimized line edge roughness. Specifically, an alternating copolymer of α-trifluoroacrylic acid with norbornene is minimized in surface roughness after etching and is thus advantageous in solving the problems of ArF resists including line edge roughness and etching resistance.

In a first aspect, the invention provides a polymer comprising recurring units having the general formulae (1a), (1b) and (1c).

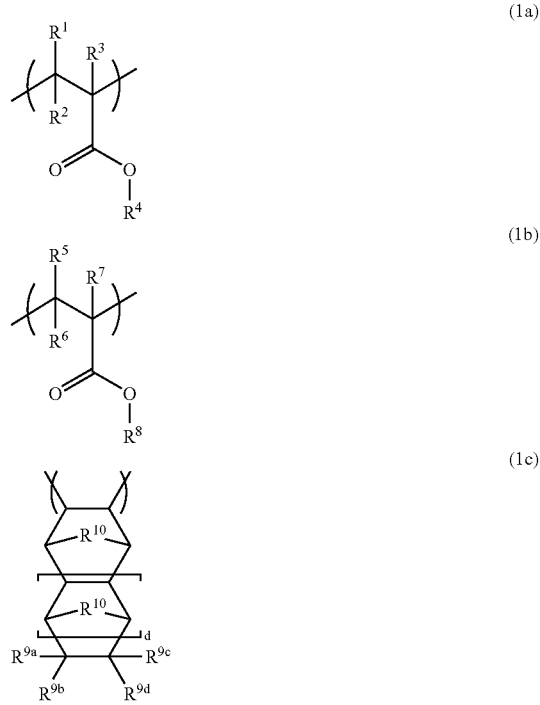

Herein $R^1$, $R^2$, $R^5$, and $R^6$ each are a hydrogen or fluorine atom, $R^3$ and $R^7$ each are a fluorine atom or a straight, branched or cyclic fluoroalkyl group of 1 to 10 carbon atoms, $R^4$ is an acid labile group, $R^8$ is an adhesive group, $R^{9a}$, $R^{9b}$, $R^{9c}$, and $R^{9d}$ each are hydrogen or a straight, branched or cyclic alkyl group of 1 to 20 carbon atoms which has an adhesive group selected from the class consisting of hydroxy, ether, carbonyl, acetyl, formyl, cyclic acetal, lactone, carbonate and sulfonamide, at least two of $R^{9a}$ to $R^{9d}$ may bond together to form a ring, with the proviso that all of $R^{9a}$ to $R^{9d}$ are not hydrogen atoms at the same time, $R^{10}$ is a methylene group, ethylene group, oxygen atom or sulfur atom, and d is 0 or 1. Typically, $R^3$ and $R^7$ each are trifluoromethyl.

In a preferred embodiment, the acid labile group represented by $R^4$ is at least one group selected from groups having the general formulae (2) to (4).

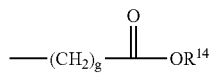

(2)

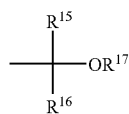

(3)

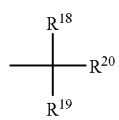

(4)

Herein $R^{14}$ and $R^{17}$ each are a monovalent hydrocarbon group of 1 to 20 carbon atoms, $R^{15}$ and $R^{16}$ each are hydrogen or a straight, branched or cyclic alkyl group of 1 to 20 carbon atoms, $R^{18}$ to $R^{20}$ each are a monovalent hydrocarbon group of 1 to 20 carbon atoms in which some hydrogen atoms may be replaced by fluorine atoms, $R^{14}$ to $R^{20}$ may contain a heteroatom such as oxygen, sulfur, nitrogen or fluorine, a pair of $R^{15}$ and $R^{16}$, $R^{15}$ and $R^{17}$, $R^{16}$ and $R^{17}$, $R^{18}$ and $R^{19}$, $R^{18}$ and $R^{20}$, and $R^{19}$ and $R^{20}$ each may bond together to form a ring of 3 to 20 carbon atoms, especially 4 to 12 carbon atoms, with the carbon atom or the carbon and oxygen atoms with which they bond, said ring is monocyclic, heterocyclic or the like, and g is a number of 0 to 10.

In a preferred embodiment, the adhesive group represented by $R^8$ is at least one group selected from the following list of groups.

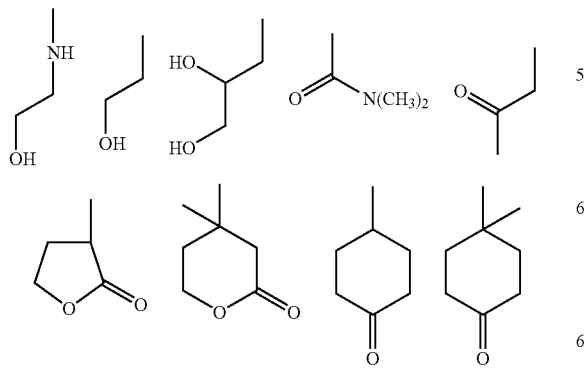

-continued

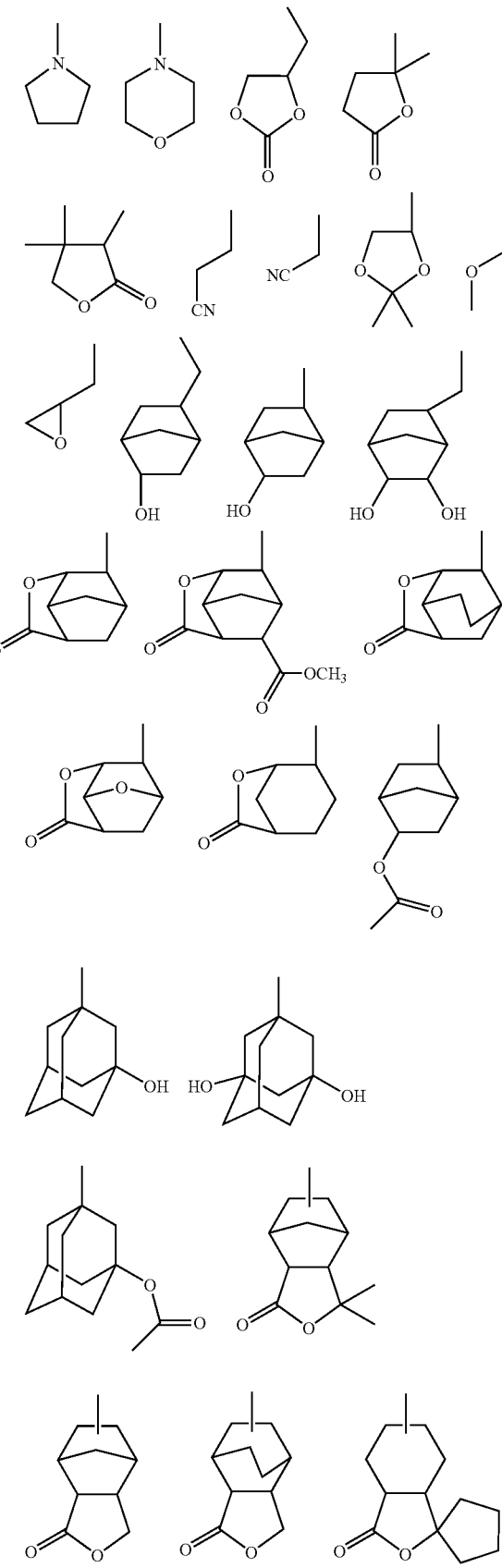

-continued

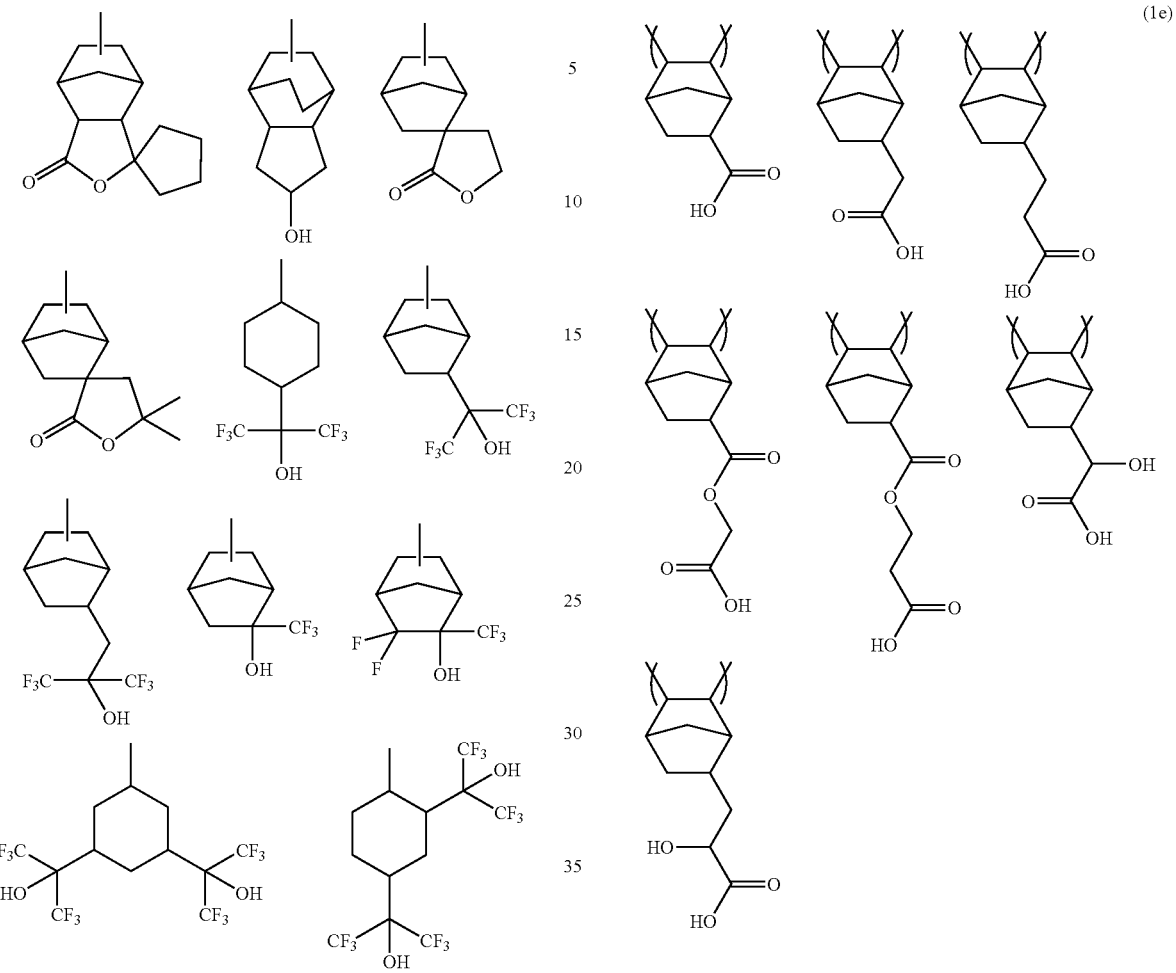

The polymer may further comprise recurring units of at least one type selected from the following list of formula (1d).

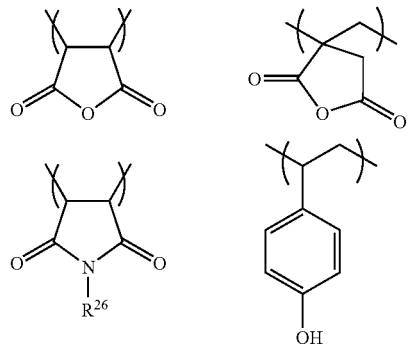

Herein $R^{26}$ is hydrogen, hydroxy or a straight, branched or cyclic alkyl group of 1 to 10 carbon atoms.

The polymer may further comprise recurring units of at least one type selected from the following list of formula (1e).

In a second aspect, the invention provides a resist composition comprising the inventive polymer. More specifically, a chemically amplified positive resist composition comprising (A) the inventive polymer, (B) an organic solvent, and (C) a photoacid generator is provided. The chemically amplified resist composition may further comprise (D) a basic compound and/or (E) a dissolution inhibitor.

In a third aspect, the invention provides a process for forming a pattern comprising the steps of (1) applying the resist composition onto a substrate to form a coating, (2) heat treating the coating and then exposing it to high-energy radiation having a wavelength of up to 200 nm through a photomask, and (3) optionally heat treating the exposed coating and developing it with a developer. The high-energy radiation is typically from an ArF excimer laser.

The resist composition of the invention is sensitive to high-energy radiation and exhibits a high sensitivity at wavelengths of up to 200 nm. Owing to the use of a copolymer of an acrylate monomer containing a fluoroalkyl group at α-position with a norbornene derivative as a base resin, the resist composition is improved in transparency and at the same time, fully resistant to plasma etching. Due to these advantages, the inventive resist composition shows minimal absorption at the exposure wavelength of an ArF excimer laser, can form a finely defined pattern having sidewalls perpendicular to the substrate, and is thus ideal as a micropatterning material in VLSI fabrication.

DESCRIPTION OF THE PREFERRED EMBODIMENTS

Polymer

One embodiment of the invention is a polymer or high molecular weight compound comprising recurring units having the general formulae (1a), (1b) and (1c).

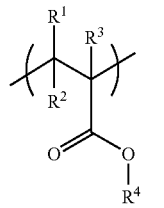
(1a)

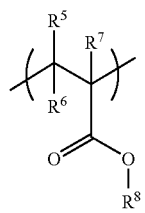
(1b)

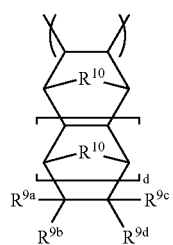
(1c)

Herein $R^1$, $R^2$, $R^5$, and $R^6$ each are a hydrogen or fluorine atom. $R^3$ and $R^7$ each are a fluorine atom or a straight, branched or cyclic fluoroalkyl group of 1 to 10 carbon atoms. $R^4$ is an acid labile group. $R^8$ is an adhesive group. $R^{9a}$, $R^{9b}$, $R^{9c}$, and $R^{9d}$ each are hydrogen or a straight, branched or cyclic alkyl group of 1 to 20 carbon atoms which has an adhesive group selected from among hydroxy, ether, carbonyl, acetyl, formyl, cyclic acetal, lactone, carbonate and sulfonamide, at least two of $R^{9a}$ to $R^{9d}$ may bond together to form a ring, with the proviso that all of $R^{9a}$ to $R^{9d}$ are not hydrogen atoms at the same time. $R^{10}$ is a methylene group, ethylene group, oxygen atom or sulfur atom. The subscript d is 0 or 1.

Examples of the straight, branched or cyclic alkyl group of 1 to 20 carbon atoms include methyl, ethyl, propyl, isopropyl, n-propyl, sec-butyl, tert-butyl, cyclopentyl, cyclohexyl, 2-ethylhexyl, and n-octyl, with those groups having 1 to 12 carbon atoms, especially 1 to 10 carbon atoms being preferred. Fluoroalkyl groups are the foregoing alkyl groups in which some or all of the hydrogen atoms are replaced by fluorine atoms, such as, for example, trifluoromethyl, pentafluoroethyl, heptafluoropropyl and nonafluorobutyl.

The acid labile group represented by $R^4$ is selected from a variety of such groups, preferably from among the groups of the following formulae (2) to (4).

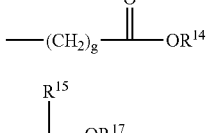

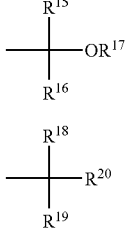

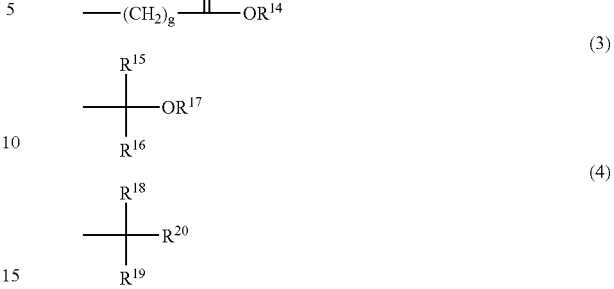

Herein $R^{14}$ and $R^{17}$ each are a monovalent hydrocarbon group of 1 to 20 carbon atoms, typically straight, branched or cyclic alkyl group, $R^{15}$ and $R^{16}$ each are hydrogen or a straight, branched or cyclic alkyl group of 1 to 20 carbon atoms, $R^{18}$ to $R^{20}$ each are a monovalent hydrocarbon group of 1 to 20 carbon atoms, typically straight, branched or cyclic alkyl group, in which some hydrogen atoms may be replaced by fluorine atoms. $R^{14}$ to $R^{20}$ may contain a heteroatom such as oxygen, sulfur, nitrogen or fluorine. A pair of $R^{15}$ and $R^{16}$, $R^{15}$ and $R^{17}$, $R^{16}$ and $R^{17}$, $R^{18}$ and $R^{19}$, $R^{18}$ and $R^{20}$, and $R^{19}$ and $R^{20}$ each may bond together to form a ring of 3 to 20 carbon atoms, especially 4 to 12 carbon atoms, with the carbon atom or the carbon and oxygen atoms with which they bond, the ring is monocyclic, heterocyclic or the like. The subscript g is a number of 0 to 10.

Preferred embodiments are described below.

In formula (2), $R^{14}$ is preferably a tertiary alkyl group of 4 to 20 carbon atoms, especially 4 to 15 carbon atoms. Illustrative examples of formula (2) include, but are not limited to, tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (3), $R^{15}$ and $R^{16}$ each are hydrogen or a straight, branched or cyclic alkyl group of 1 to 20 carbon atoms, preferably 1 to 18 carbon atoms, more preferably 1 to 10 carbon atoms, examples of which include methyl, ethyl, n-propyl, isopropyl, n-butyl, sec-butyl, tert-butyl, cyclopentyl, cyclohexyl, 2-ethylcyclohexyl, and n-octyl. $R^{17}$ is a monovalent hydrocarbon group of 1 to 20 carbon atoms, preferably 1 to 10 carbon atoms, which may contain a heteroatom such as oxygen, examples of which include straight, branched or cyclic alkyl groups and substituted alkyl groups in which some hydrogen atoms are replaced by hydroxyl, alkoxy, oxo, amino or alkylamino groups. Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl, and illustrative examples of the straight or branched groups are given below.

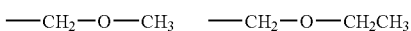

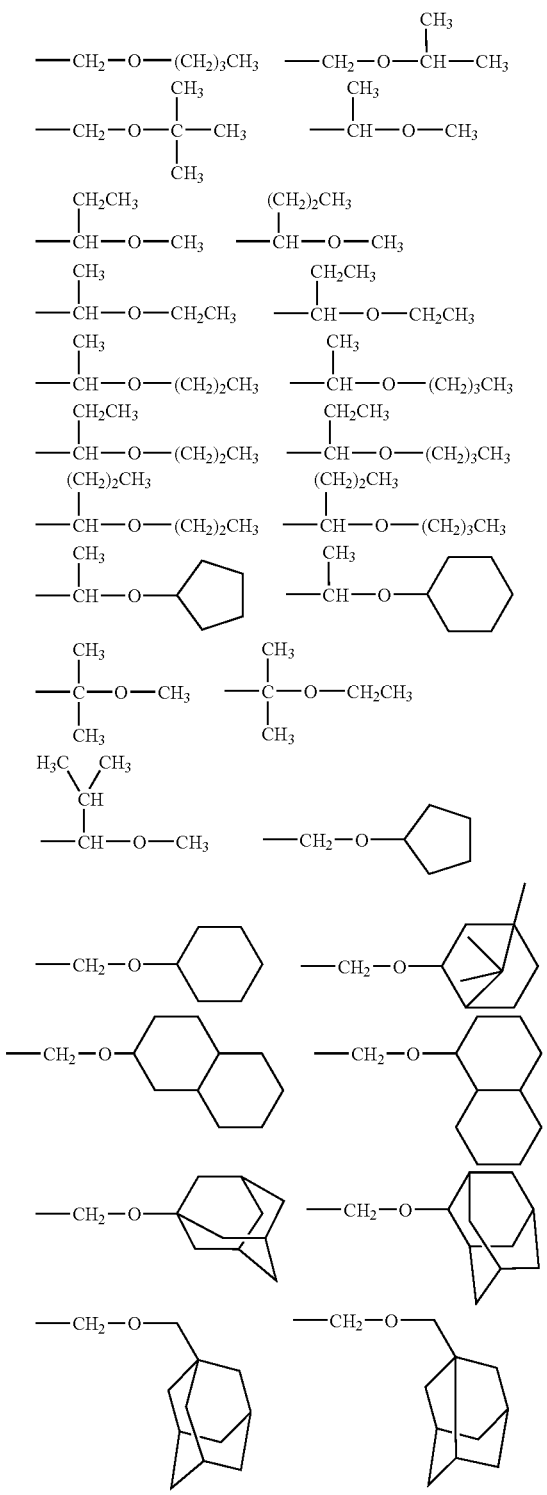

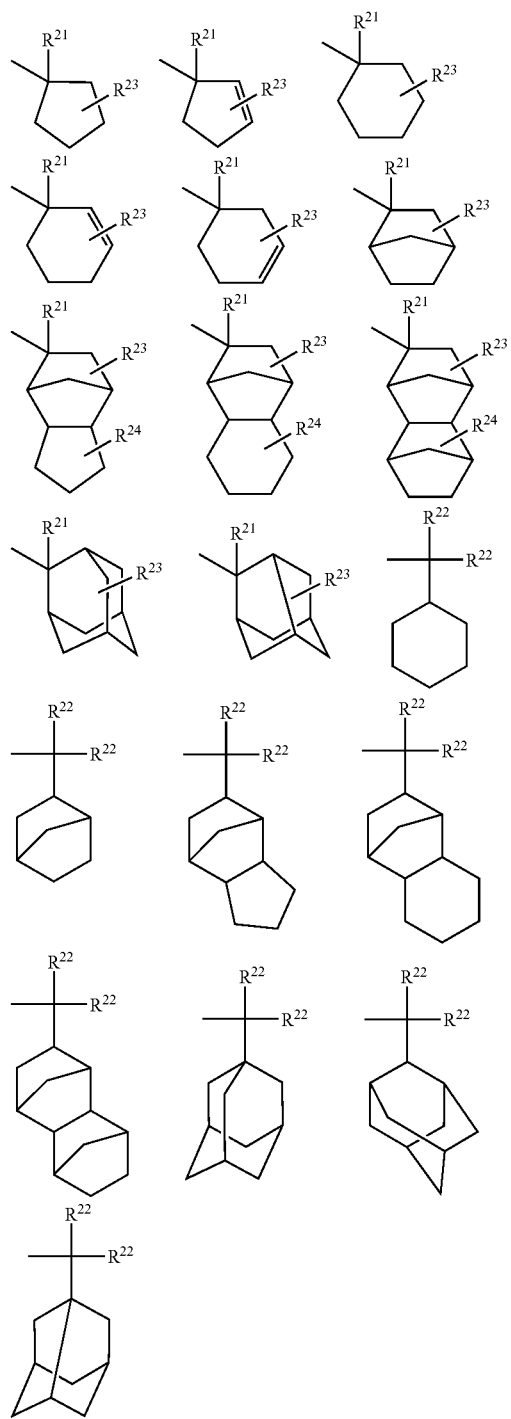

methyl-isopropyl, and 1,1,1,3,3,3-hexafluoro-2-cyclohexyl-isopropyl, as well as the groups shown below.

Of the groups of formula (3), ethoxyethyl, butoxyethyl and ethoxypropyl are preferred.

Examples of the tertiary alkyl groups of formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-

Herein, $R^{21}$ is a straight, branched or cyclic alkyl group of 1 to 6 carbon atoms, $R^{22}$ is a straight, branched or cyclic alkyl group of 2 to 6 carbon atoms, $R^{23}$ and $R^{24}$ each are hydrogen or a monovalent hydrocarbon group of 1 to 6 carbon atoms which may contain a heteroatom or which may be separated by a heteroatom. The heteroatom is an oxygen, sulfur or nitrogen atom, which is contained or intervenes in the form of —OH, —OR$^{25}$, —O—, —S—, —S(=O)—, —NH$_2$, —NHR$^{25}$, —N(R$^{25}$)$_2$, —NH—, or —NR$^{25}$— wherein R$^{25}$ is a straight, branched or cyclic alkyl group of 1 to 10 carbon atoms.

Examples of R$^{21}$ include methyl, ethyl, propyl, isopropyl, n-butyl, sec-butyl, n-pentyl, n-hexyl, cyclopropyl, cyclopropylmethyl, cyclobutyl, cyclopentyl, cyclohexyl, etc. Examples of R$^{22}$ include ethyl, propyl, isopropyl, n-butyl, sec-butyl, n-pentyl, n-hexyl, cyclopropyl, cyclopropylmethyl, cyclobutyl, cyclopentyl, cyclohexyl, etc. R$^{23}$ and R$^{24}$ typically stand for hydrogen and straight, branched or cyclic alkyl, hydroxyalkyl, alkoxy, and alkoxyalkyl groups, examples of which include methyl, hydroxymethyl, ethyl, hydroxyethyl, propyl, isopropyl, n-butyl, sec-butyl, n-pentyl, n-hexyl, methoxy, methoxymethoxy, ethoxy, tert-butoxy, etc.

The adhesive group represented by R$^8$ is selected from a variety of such groups, preferably from among the groups of the following formulae.

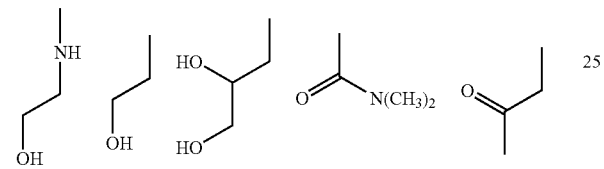

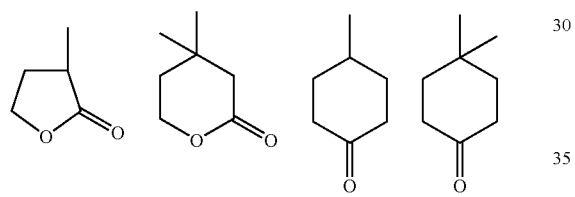

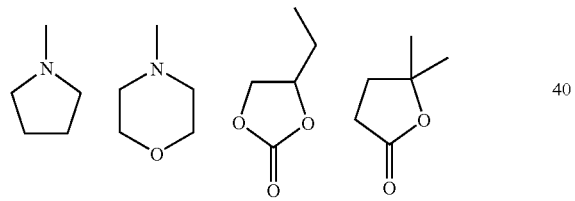

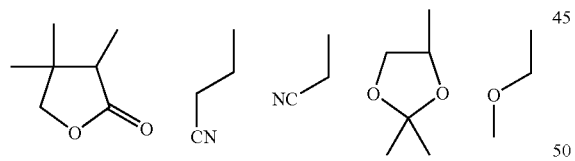

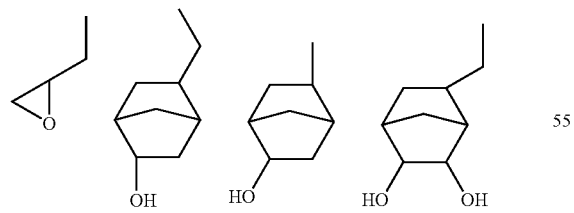

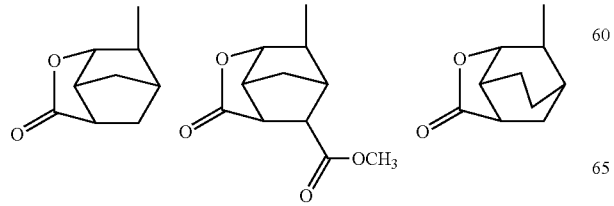

-continued

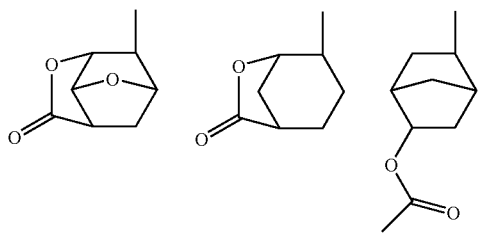

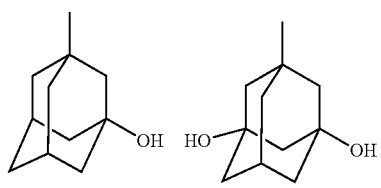

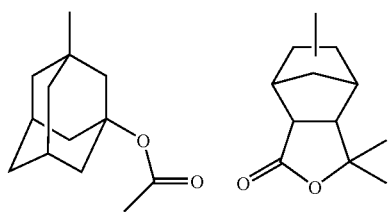

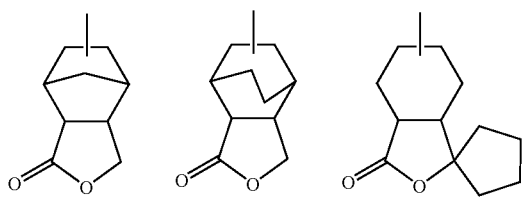

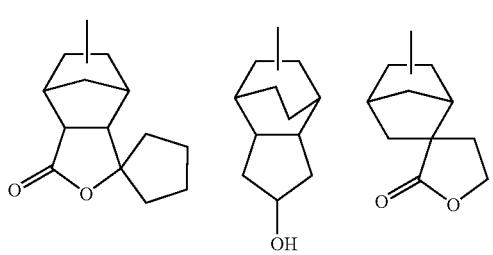

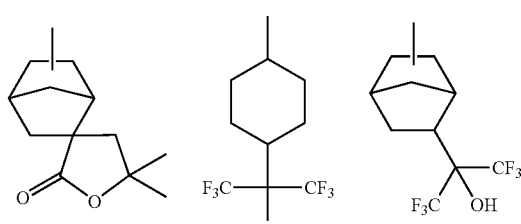

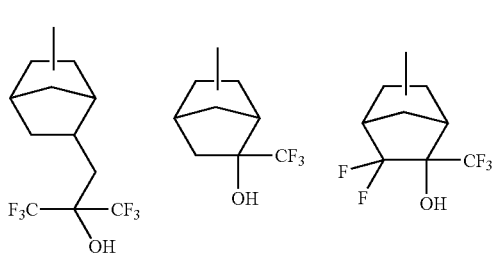

-continued

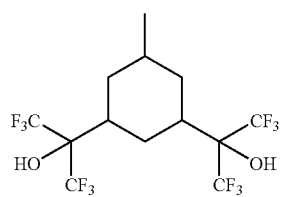 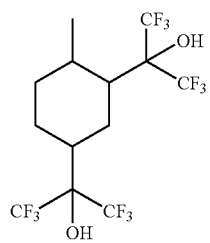

Referring to formula (1c), $R^{9a}$, $R^{9b}$, $R^{9c}$, and $R^{9d}$ each are hydrogen or a straight, branched or cyclic alkyl group of 1 to 20 carbon atoms which has an adhesive group selected from among hydroxy, ether, carbonyl, acetyl, formyl, cyclic acetal, lactone, carbonate, and sulfonamide. It is excluded that all of $R^{9a}$ to $R^{9d}$ are hydrogen atoms at the same time. At least two of $R^{9a}$ to $R^{9d}$ may bond together to form a ring, which preferably has 3 to 12 carbon atoms, especially 4 to 8 carbon atoms, and is typically monocyclic. The ring has an adhesive group selected from among hydroxy, ether, carbonyl, acetal, lactone, and carbonate.

Examples of straight, branched or cyclic alkyl groups of 1 to 20 carbon atoms include methyl, ethyl, propyl, isopropyl, n-propyl, sec-butyl, tert-butyl, cyclopentyl, cyclohexyl, 2-ethylhexyl, and n-octyl, with those groups having 1 to 12 carbon atoms, especially 1 to 10 carbon atoms being preferred.

Illustrative examples of formula (1c) are given below.

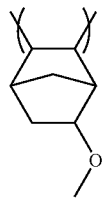  

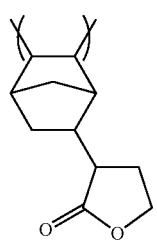 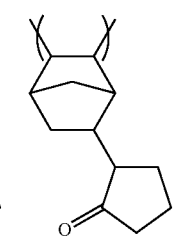 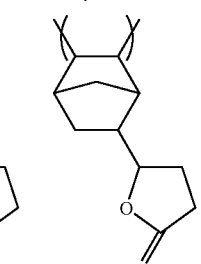

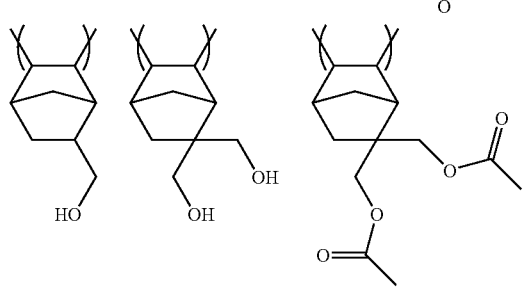

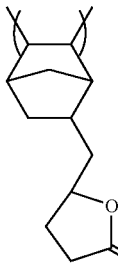 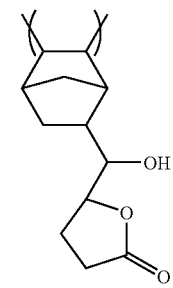

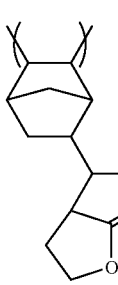 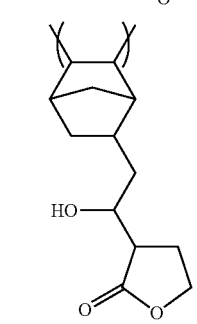

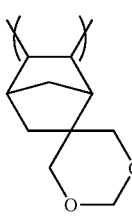 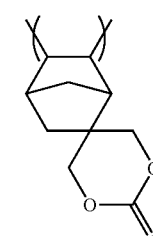 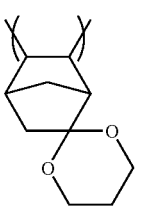

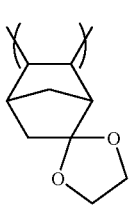 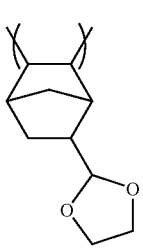 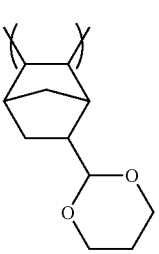

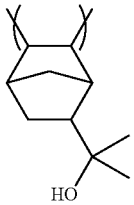 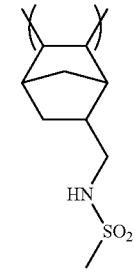 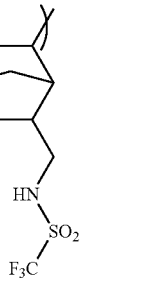

-continued

Herein $R^{26}$ is hydrogen, hydroxy or a straight, branched or cyclic alkyl group of 1 to 10 carbon atoms.

In addition to the recurring units (1c) of norbornene having an adhesive group, any recurring units of norbornene having a carboxyl group selected from the following list of formula (1e) may be further copolymerized.

While the polymers of the invention are fully adhesive even with only the adhesive groups $R^8$ in units (1b) and the units (1c), any recurring units selected from the following list of formula (1d) may be further copolymerized therewith for further improving adhesion.

The inventive polymers are generally synthesized by dissolving monomers corresponding to units of formulae (1a), (1b) and (1c), and optional adhesion-improving monomers corresponding to units of formulae (1d) and (1e) in a solvent, adding a catalyst thereto, and effecting polymerization reaction while heating or cooling the system if necessary.

Of the monomers from which recurring units (1a) and (1b) are derived, those monomers shown below are preferred.

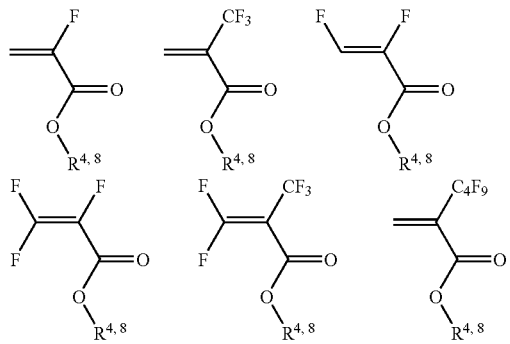

The polymerization reaction depends on the type of initiator or catalyst, trigger means (including light, heat, radiation and plasma), and polymerization conditions (including temperature, pressure, concentration, solvent, and additives). Commonly used for the polymerization of the monomers are radical polymerization of triggering polymerization with radical polymerization initiators such as azobisisobutyronitrile (AIBN), and ion (anion) polymerization using catalysts such as alkyl lithium. Such polymerization may be effected in a conventional manner.

The radical polymerization initiator used herein is not critical. Exemplary initiators include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), and 2,2'-azobis(2,4,4-trimethylpentane); peroxide compounds such as tert-butyl peroxypivalate, lauroyl peroxide, benzoyl peroxide and tert-butyl peroxylaurate; water-soluble initiators, for example, persulfate salts such as potassium persulfate; and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more.

Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under reduced pressure.

Desirably the polymer has a weight average molecular weight (Mw) of about 1,000 to about 1,000,000, and especially about 2,000 to about 100,000, as measured by gel permeation chromatography (GPC) using polystyrene standards.

Provided that a, b and c represent the contents of recurring units (1a), (1b) and (1c), respectively, d represents the content of recurring units (1d), and e represents the content of recurring units (1e), the value of $a/(a+b+c+d+e)$ is preferably in a range of 0.2 to 0.7, more preferably 0.25 to 0.6, the value of $b/(a+b+c+d+e)$ is preferably in a range of 0.05 to 0.5, more preferably 0.08 to 0.4, and the value of $c/(a+b+c+d+e)$ is preferably in a range of 0.1 to 0.7, more preferably 0.2 to 0.6. The value of $d/(a+b+c+d+e)$ is preferably in a range of 0 to 0.6, more preferably 0 to 0.5, and the value of $e/(a+b+c+d+e)$ is preferably in a range of 0 to 0.3, more preferably 0 to 0.2.

The polymer of the invention can be used as a base resin in resist compositions, specifically chemically amplified resist compositions, and especially chemically amplified positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical, and any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

Component (C)

Suitable examples of the photoacid generator (C) include onium salts of formula (5) below, diazomethane derivatives of formula (6), glyoxime derivatives of formula (7), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (5).

$$(R^{27})_iM^+K^- \quad (5)$$

In the formula, $R^{27}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter i is 2 or 3.

Illustrative examples of alkyl groups represented by $R^{27}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Examples of suitable onium salts include, but are not limited to, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethane-sulfonate, cyclohexylmethyl(2-oxocyclohexyl)sulfonium trifluoromethane-sulfonate, (2-norbornyl)methyl(2-oxocyclohexyl)sulfonium trifluoro-methanesulfonate, ethylenebis [methyl(2-oxocyclopentyl)sulfonium trifluoro-methane-sulfonate], and 1,2'-naphthylcarbonylmethyltetrahydrothiophenium triflate.

The diazomethane derivatives used as the photoacid generator are of the general formula (6).

$$R^{28}-SO_2-\overset{N_2}{\underset{\|}{C}}-SO_2-R^{29} \quad (6)$$

In the formula, $R^{28}$ and $R^{29}$ are straight, branched or cyclic alkyl or haloalkyl groups of 1 to 12 carbon atoms, aryl or haloaryl groups of 6 to 12 carbon atoms, or aralkyl groups of 7 to 12 carbon atoms.

Illustrative examples of alkyl groups represented by $R^{28}$ and $R^{29}$ include methyl, ethyl, propyl, butyl, amyl, cyclopentyl, cyclohexyl, norbornyl, and adamantyl. Exemplary haloalkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

Examples of suitable diazomethane derivatives include, but are not limited to, bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

The glyoxime derivatives used as the photoacid generator are of the general formula (7).

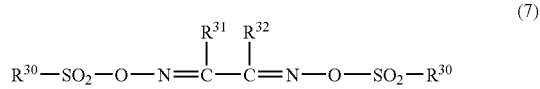

$$R^{30}-SO_2-O-N=\overset{R^{31}}{\underset{|}{C}}-\overset{R^{32}}{\underset{|}{C}}=N-O-SO_2-R^{30} \quad (7)$$

In the formula, $R^{30}$ to $R^{32}$ are straight, branched or cyclic alkyl or haloalkyl groups of 1 to 12 carbon atoms, aryl or haloaryl groups of 6 to 12 carbon atoms, or aralkyl groups of 7 to 12 carbon atoms. $R^{31}$ and $R^{32}$ may bond together to form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{30}$ to $R^{32}$ are exemplified by the same groups as mentioned above for $R^{28}$ and $R^{29}$.

Examples of alkylene groups represented by $R^{31}$ and $R^{32}$ include methylene, ethylene, propylene, butylene, and hexylene.

Examples of suitable glyoxime derivatives include, but are not limited to,
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime.

Other useful photoacid generators include β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
imidoyl sulfonate derivatives such as
phthalimidoyl triflate, phthalimidoyl tosylate,
5-norbornene-2,3-dicarboxyimidoyl triflate,
5-norbornene-2,3-dicarboxyimidoyl tosylate, and
5-norbornene-2,3-dicarboxyimidoyl n-butylsulfonate.

Preferred among the foregoing photoacid generators are onium salts such as
triphenylsulfonium trifluoromethanesulfonate, (p-tert-butoxyphenyl)diphenylsulfonium trifluoromethane-sulfonate,
tris(p-tert-butoxyphenyl)sulfonium trifluoromethane-sulfonate, triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane; and
glyoxime derivatives such as
bis-O-(p-toluenesulfonyl)-α-dimethylglyoxime and
bis-O-(n-butanesulfonyl)-α-dimethylglyoxime.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure may be too small and the sensitivity and resolution be poor, whereas the addition of more than 15 parts may result in lower transparency and a degraded resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, imide derivatives, and carbamate derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole, and oxazolidinone.

Nitrogen-containing organic compounds of the following general formula (B)-1 are also useful.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

(X)-1

(X)-2

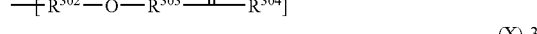

(X)-3

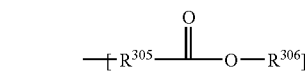

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is hydrogen or a straight, branched or cyclic alkyl group of 1 to 20 carbon atoms, which may contain at least one hydroxyl, ether, ester group or lactone ring.

Illustrative examples of the compounds of formula (B)-1 include
tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine, tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are nitrogen-containing organic compounds having cyclic structure, represented by the following general formula (B)-2.

(B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate, 2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, nitrogen-containing organic compounds having cyano group, represented by the following general formulae (B)-3 to (B)-6 are useful.

(B)-3

(B)-4

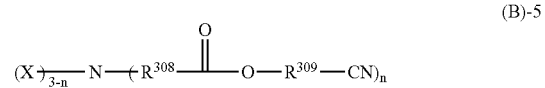

(B)-5

-continued

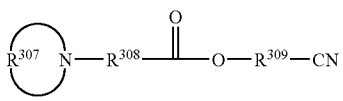
(B)-6

Herein, X, $R^{307}$ and n are as defined above, and $R^{308}$ and $R^{309}$ are each independently a straight or branched alkylene group of 1 to 4 carbon atoms.

Illustrative examples of the nitrogen-containing organic compounds having cyano group, represented by formulae (B)-3 to (B)-6, include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiono-nitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are nitrogen-containing organic compounds having an imidazole structure and a polar functional group, represented by the following general formula (B)-7.

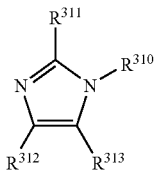
(B)-7

Herein, $R^{310}$ is a straight, branched or cyclic $C_2-C_{20}$ alkyl group having at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

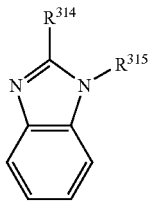
(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic $C_1$–$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

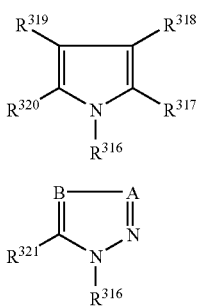

Herein, A is a nitrogen atom or ≡C—$R^{322}$, B is a nitrogen atom or ≡C—$R^{323}$, $R^{316}$ is a straight, branched or cyclic $C_2$–$C_{20}$ alkyl group having at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

The nitrogen-containing organic compound is preferably formulated in an amount of 0.001 to 2 parts, and especially 0.01 to 1 part by weight, per 100 parts by weight of the entire base resin. Less than 0.001 part of the nitrogen-containing organic compound achieves no or little addition effect whereas more than 2 parts would result in too low a sensitivity.

Component (E)

The dissolution inhibitor (E) is a compound with a molecular weight of up to 3,000 which changes its solubility in an alkaline developer under the action of an acid, and typically selected from phenol and carboxylic acid derivatives in which some or all of hydroxyl groups are substituted with acid labile groups and which have a molecular weight of up to 2,500. The acid labile groups may be either the fluorine-containing groups enumerated herein or conventional fluorine-free groups.

Examples of the phenol or carboxylic acid derivative having a molecular weight of up to 2,500 include
4,4'-(1-methylethylidene)bisphenol,
(1,1'-biphenyl-4,4'-diol)-2,2'-methylenebis(4-methylphenol),
4,4-bis(4'-hydroxyphenyl)valeric acid,
tris(4-hydroxyphenyl)methane,
1,1,1-tris(4'-hydroxyphenyl)ethane,
1,1,2-tris(4'-hydroxyphenyl)ethane, phenolphthalein,
thimolphthalein, 3,3'-difluoro[(1,1'-biphenyl)-4,4'-diol],
3,3',5,5'-tetrafluoro[(1,1'-biphenyl)-4,4'-diol],
4,4'-[2,2,2-trifluoro-1-(trifluoromethyl)ethylidene]bisphenol,
4,4'-methylenebis(2-fluorophenol),
2,2'-methylenebis(4-fluorophenol),
4,4'-isopropylidenebis(2-fluorophenol),
cyclohexylidenebis(2-fluorophenol),
4,4'-[(4-fluorophenyl)methylene]bis(2-fluorophenol),
4,4'-methylenebis(2,6-difluorophenol),
4,4'-(4-fluorophenyl)methylenebis(2,6-difluorophenol),
2,6-bis[(2-hydroxy-5-fluorophenyl)methyl]-4-fluorophenol,
2,6-bis[(4-hydroxy-3-fluorophenyl)methyl]-4-fluorophenol, and
2,4-bis[(3-hydroxy-4-hydroxyphenyl)methyl]-6-methylphenol.

The acid labile groups are the same as formulae (2) to (4) described above.

Illustrative, non-limiting, examples of the dissolution inhibitors which are useful herein include
3,3',5,5'-tetrafluoro[(1,1'-biphenyl)-4,4'-di-t-butoxycarbonyl],
4,4'-[2,2,2-trifluoro-1-(trifluoromethyl)ethylidene]-bisphenol-4,4'-di-t-butoxycarbonyl,
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2''-tetrahydropyranyloxy))propane,
2,2-bis(4'-(2''-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1''-ethoxyethoxy)phenyl)propane,
2,2-bis(4'-(1''-ethoxypropyloxy)phenyl)propane,
tert-butyl 4,4-bis(4'-(2''-tetrahydropyranyloxy)phenyl)valerate,
tert-butyl 4,4-bis(4'-(2''-tetrahydrofuranyloxy)phenyl)valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl)-valerate,
tert-butyl 4,4-bis(4'-(1''-ethoxyethoxy)phenyl)valerate,
tert-butyl 4,4-bis(4'-(1''-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2''-tetrahydropyranyloxy)phenyl)ethane,
1,1,2-tris(4'-(2''-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1''-ethoxyethoxy)phenyl)ethane,
1,1,2-tris(4'-(1''-ethoxypropyloxy)phenyl)ethane,
t-butyl 2-trifluoromethylbenzenecarboxylate,
t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition of the invention, an appropriate amount of the dissolution inhibitor (E) is up to about 20 parts, and especially up to about 15 parts by weight per 100 parts by weight of the base resin in the composition. More than 20 parts of the dissolution inhibitor leads to an increased content of monomer components so that the resist composition becomes less heat resistant and allows for more acid diffusion.

In addition to the foregoing components, the resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Fluorad FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Fluorad FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional technique such as dip, puddle, or spray technique for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), KrAr excimer laser (134 nm), F$_2$ laser (157 nm), Kr$_2$ laser (146 nm) or Ar$_2$ laser (126 nm), x-rays, or an electron beam. The desired pattern may not be obtainable outside the upper and lower limits of the above range.

EXAMPLE

Examples of the invention are given below by way of illustration and not by way of limitation. The abbreviations used herein are AIBN for 2,2'-azobisisobutyronitrile, NMR for nuclear magnetic resonance, Mw for weight average molecular weight, and Mn for number average molecular weight. Mw and Mn are determined by gel permeation chromatography (GPC) using polystyrene standards.

Synthesis Example 1

Copolymerization of Monomers 1, 2 and 3

In a 500-ml flask, 19.6 g of Monomer 1, 28.9 g of Monomer 2, and 19.6 g of Monomer 3, all shown below, were dissolved in 100 ml of toluene. The system was fully purged of oxygen, charged with 0.38 g of the initiator AIBN, and heated at 60° C. at which polymerization reaction took place for 24 hours.

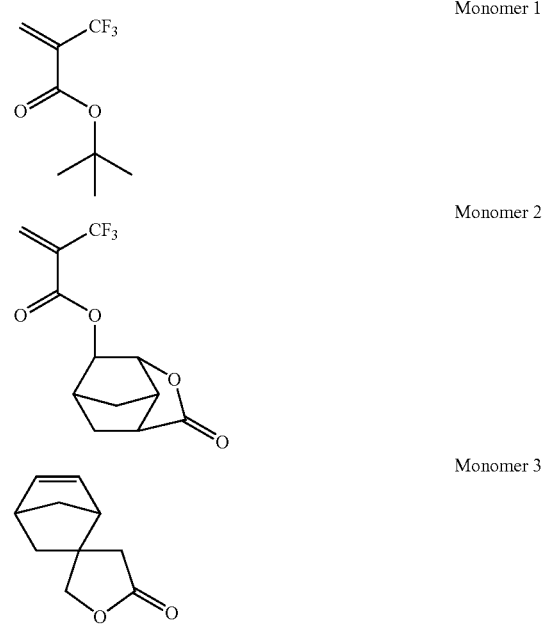

Monomer 1

Monomer 2

Monomer 3

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 47.6 g of a white polymer, which was found to have a Mw of 8,800 as measured by GPC, and a dispersity (Mw/Mn) of 1.4 as determined from the GPC elution curve. On $^1$H-NMR analysis, the polymer was found to consist of Monomer 1, Monomer 2 and Monomer 3 in a molar ratio of 41:26:33.

Synthesis Example 2

Copolymerization of Monomers 1, 2 and 4

In a 500-ml flask, 19.6 g of Monomer 1, 28.9 g of Monomer 2, and 24.1 g of Monomer 4, all shown below, were dissolved in 100 ml of toluene. The system was fully purged of oxygen, charged with 0.38 g of the initiator AIBN, and heated at 60° C. at which polymerization reaction took place for 24 hours.

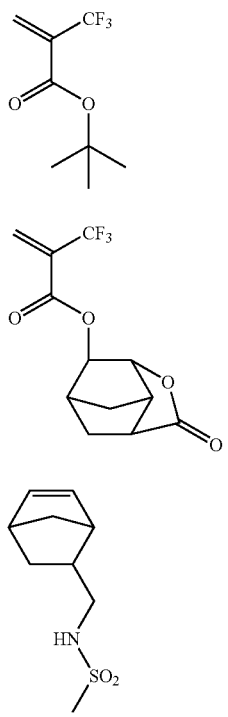

Monomer 1

Monomer 2

Monomer 4

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 53.7 g of a white polymer, which was found to have a Mw of 10,600 as measured by GPC, and a dispersity (Mw/Mn) of 1.65 as determined from the GPC elution curve. On $^1$H-NMR analysis, the polymer was found to consist of Monomer 1, Monomer 2 and Monomer 4 in a molar ratio of 40:22:38.

Synthesis Example 3

Copolymerization of Monomers 1, 5 and 6

In a 500-ml flask, 19.6 g of Monomer 1, 27.3 g of Monomer 5, and 19.8 g of Monomer 6, all shown below, were dissolved in 100 ml of toluene. The system was fully purged of oxygen, charged with 0.38 g of the initiator AIBN, and heated at 60° C. at which polymerization reaction took place for 24 hours.

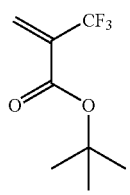

Monomer 1

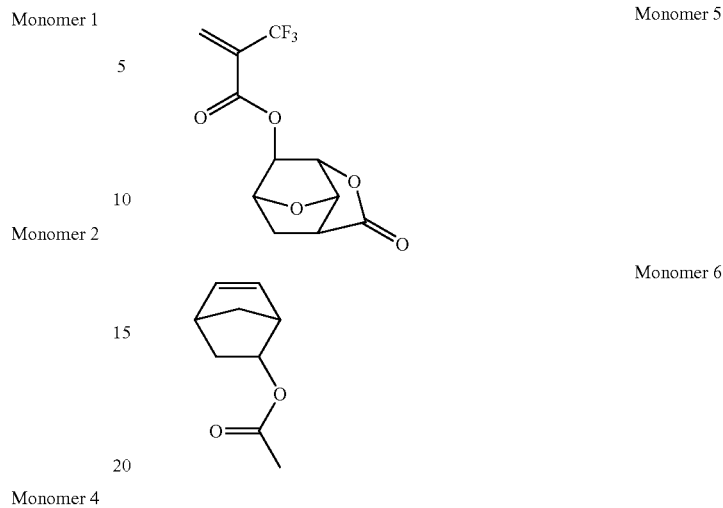

Monomer 5

Monomer 6

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 48.0 g of a white polymer, which was found to have a Mw of 9,900 as measured by GPC, and a dispersity (Mw/Mn) of 1.58 as determined from the GPC elution curve. On $^1$H-NMR analysis, the polymer was found to consist of Monomer 1, Monomer 5 and Monomer 6 in a molar ratio of 40:28:32.

Synthesis Example 4

Copolymerization of Monomers 7, 2 and 6

In a 500-ml flask, 21.2 g of Monomer 7, 28.8 g of Monomer 2, and 19.8 g of Monomer 6, all shown below, were dissolved in 100 ml of toluene. The system was fully purged of oxygen, charged with 0.38 g of the initiator AIBN, and heated at 60° C. at which polymerization reaction took place for 24 hours.

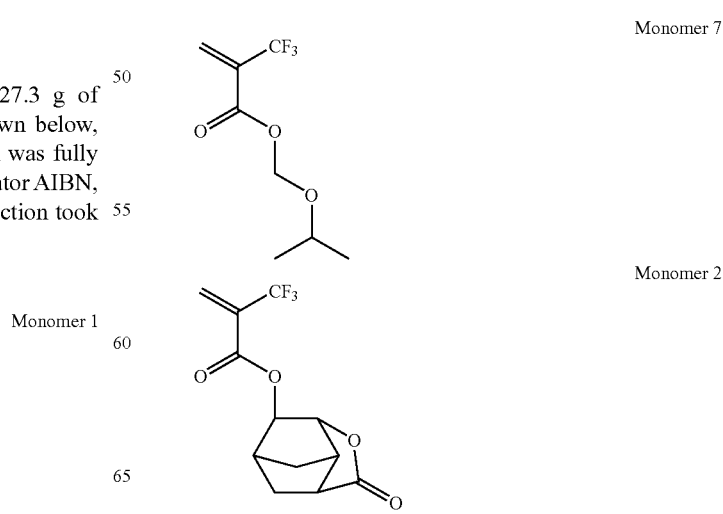

Monomer 7

Monomer 2

Monomer 6

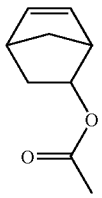

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 47.5 g of a white polymer, which was found to have a Mw of 7,800 as measured by GPC, and a dispersity (Mw/Mn) of 1.39 as determined from the GPC elution curve. On $^1$H-NMR analysis, the polymer was found to consist of Monomer 7, Monomer 2 and Monomer 6 in a molar ratio of 33:36:31.

Synthesis Example 5

Copolymerization of Monomers 8, 5 and 4

In a 500-ml flask, 28.8 g of Monomer 8, 27.6 g of Monomer 5, and 25.1 g of Monomer 4, all shown below, were dissolved in 100 ml of toluene. The system was fully purged of oxygen, charged with 0.38 g of the initiator AIBN, and heated at 60° C. at which polymerization reaction took place for 24 hours.

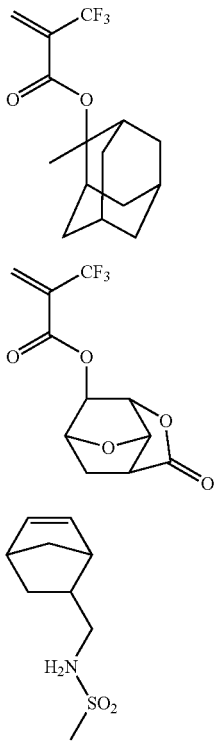

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 61.1 g of a white polymer, which was found to have a Mw of 9,500 as measured by GPC, and a dispersity (Mw/Mn) of 1.66 as determined from the GPC elution curve. On $^1$H-NMR analysis, the polymer was found to consist of Monomer 8, Monomer 5 and Monomer 4 in a molar ratio of 35:31:34.

Synthesis Example 6

Copolymerization of Monomers 8, 5 and 9

In a 500-ml flask, 28.8 g of Monomer 8, 27.6 g of Monomer 5, and 21.0 g of Monomer 9, all shown below, were dissolved in 100 ml of toluene. The system was fully purged of oxygen, charged with 0.38 g of the initiator AIBN, and heated at 60° C. at which polymerization reaction took place for 24 hours.

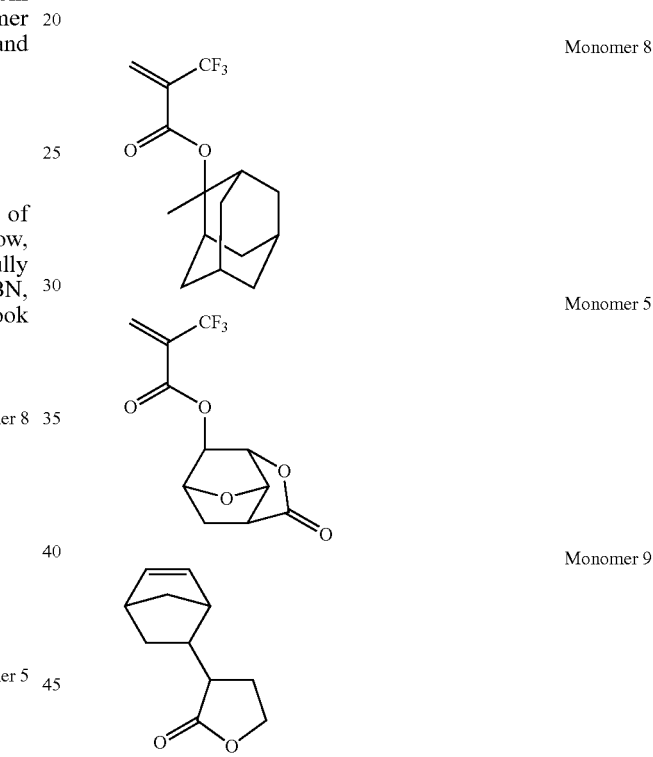

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 57.2 g of a white polymer, which was found to have a Mw of 7,100 as measured by GPC, and a dispersity (Mw/Mn) of 1.48 as determined from the GPC elution curve. On $^1$H-NMR analysis, the polymer was found to consist of Monomer 8, Monomer 5 and Monomer 9 in a molar ratio of 35:37:28.

Synthesis Example 7

Copolymerization of Monomers 8, 5 and 10

In a 500-ml flask, 28.8 g of Monomer 8, 27.6 g of Monomer 5, and 16.6 g of Monomer 10, all shown below, were dissolved in 100 ml of toluene. The system was fully purged of oxygen, charged with 0.38 g of the initiator AIBN, and heated at 60° C. at which polymerization reaction took place for 24 hours.

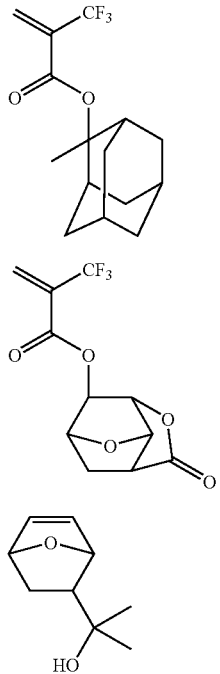

Monomer 8

Monomer 5

Monomer 10

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 56.2 g of a white polymer, which was found to have a Mw of 10,200 as measured by GPC, and a dispersity (Mw/Mn) of 1.74 as determined from the GPC elution curve. On $^1$H-NMR analysis, the polymer was found to consist of Monomer 8, Monomer 5 and Monomer 10 in a molar ratio of 32:31:37.

Synthesis Example 8

Copolymerization of Monomers 8, 5 and 11

In a 500-ml flask, 28.8 g of Monomer 8, 27.6 g of Monomer 5, and 21.8 g of Monomer 11, all shown below, were dissolved in 100 ml of toluene. The system was fully purged of oxygen, charged with 0.38 g of the initiator AIBN, and heated at 60° C. at which polymerization reaction took place for 24 hours.

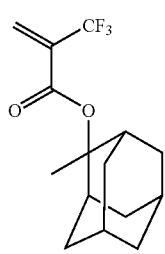

Monomer 8

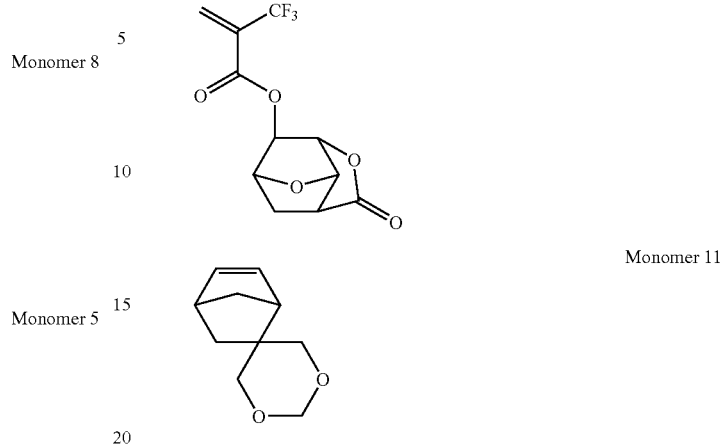

Monomer 5

Monomer 11

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 53.8 g of a white polymer, which was found to have a Mw of 7,200 as measured by GPC, and a dispersity (Mw/Mn) of 1.43 as determined from the GPC elution curve. On $^1$H-NMR analysis, the polymer was found to consist of Monomer 8, Monomer 5 and Monomer 11 in a molar ratio of 38:31:31.

Synthesis Example 9

Copolymerization of Monomers 15, 16, 17, 18 and 3

In a 500-ml flask, 15 g of Monomer 15, 9.8 g of Monomer 16, 4.6 g of Monomer 17, 3.3 g of Monomer 18, and 5.6 g of Monomer 3, all shown below, were dissolved in 100 ml of toluene. The system was fully purged of oxygen, charged with 0.38 g of the initiator AIBN, and heated at 60° C. at which polymerization reaction took place for 24 hours.

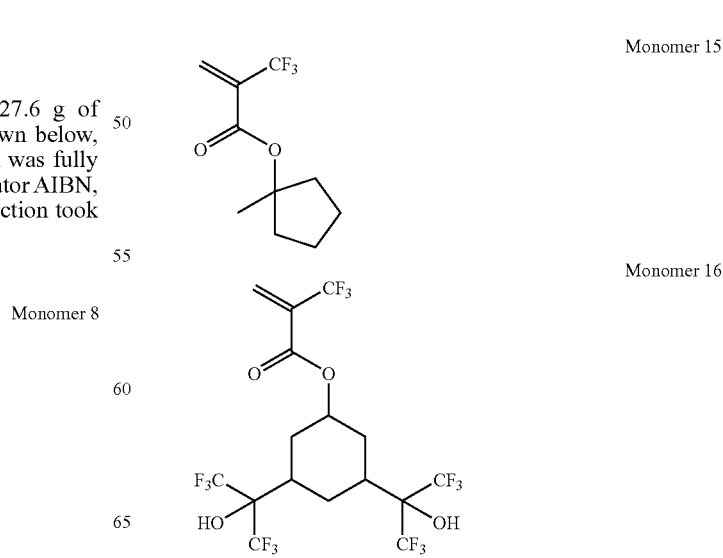

Monomer 15

Monomer 16

-continued

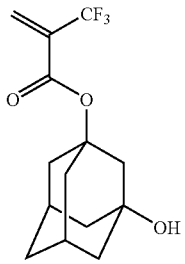
Monomer 17

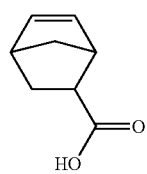
Monomer 18

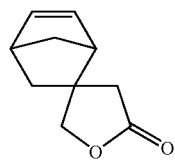
Monomer 3

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 53.8 g of a white polymer, which was found to have a Mw of 8,500 as measured by GPC, and a dispersity (Mw/Mn) of 1.48 as determined from the GPC elution curve. On $^1$H-NMR analysis, the polymer was found to consist of Monomer 15, Monomer 16, Monomer 17, Monomer 18, and Monomer 3 in a molar ratio of 45:15:12:13:15.

Synthesis Example 10

Copolymerization of Monomers 15, 16, 17, 19 and 3

In a 500-ml flask, 15 g of Monomer 15, 9.8 g of Monomer 16, 4.6 g of Monomer 17, 3.6 g of Monomer 19, and 5.6 g of Monomer 3, all shown below, were dissolved in 100 ml of toluene. The system was fully purged of oxygen, charged with 0.38 g of the initiator AIBN, and heated at 60° C. at which polymerization reaction took place for 24 hours.

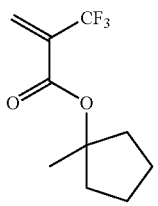
Monomer 15

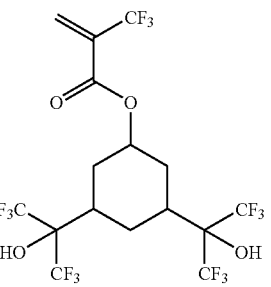
Monomer 16

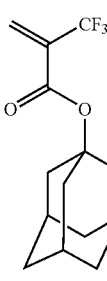
Monomer 17

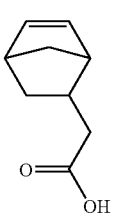
Monomer 19

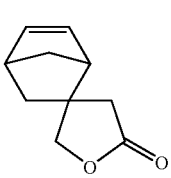
Monomer 3

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 53.8 g of a white polymer, which was found to have a Mw of 8,500 as measured by GPC, and a dispersity (Mw/Mn) of 1.48 as determined from the GPC elution curve. On $^1$H-NMR analysis, the polymer was found to consist of Monomer 15, Monomer 16, Monomer 17, Monomer 19, and Monomer 3 in a molar ratio of 45:14:12:10:19.

Comparative Synthesis Example 1

Copolymerization of Monomers 12, 13 and 14

In a 500-ml flask, 32.3 g of Monomer 12, 20.3 g of Monomer 13, and 23.6 g of Monomer 14, all shown below, were dissolved in 200 ml of toluene. The system was fully purged of oxygen, charged with 0.38 g of the initiator AIBN, and heated at 60° C. at which polymerization reaction took place for 24 hours.

Monomer 12

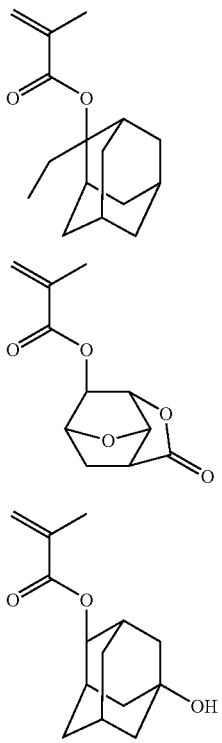

Monomer 13

Monomer 14

The polymer thus obtained was worked up by pouring the reaction mixture into hexane whereupon the polymer precipitated. The polymer collected was dissolved in tetrahydrofuran and poured into 2 liters of hexane for precipitation. This cycle was repeated twice. The polymer was isolated and dried. There was obtained 62.0 g of a white polymer, which was found to have a Mw of 9,800 as measured by GPC, and a dispersity (Mw/Mn) of 1.89 as determined from the GPC elution curve. On $^1$H-NMR analysis, the polymer was found to consist of Monomer 12, Monomer 13 and Monomer 14 in a molar ratio of 35:45:20.

Comparative Synthesis Example 2

Copolymerization of Monomers 12, 3 and Maleic Anhydride

In a 500-ml flask, 16.2 g of Monomer 12, 16.4 g of Monomer 3, and 9.8 g of maleic anhydride, all shown below, were dissolved in 40 ml of toluene. The system was fully purged of oxygen, charged with 0.38 g of the initiator AIBN, and heated at 60° C. at which polymerization reaction took place for 24 hours.

Monomer 12

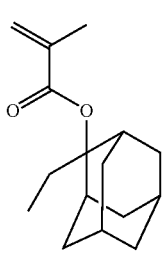

-continued

Monomer 3

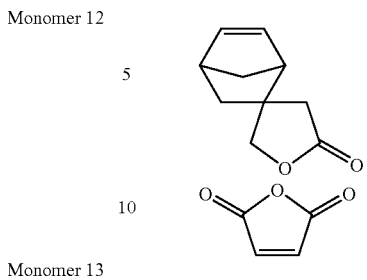

The polymer thus obtained was worked up by pouring the reaction mixture into hexane whereupon the polymer precipitated. The polymer collected was dissolved in tetrahydrofuran and poured into 1 liter of hexane for precipitation. This cycle was repeated twice. The polymer was isolated and dried. There was obtained 28.8 g of a white polymer, which was found to have a Mw of 7,500 as measured by GPC, and a dispersity (Mw/Mn) of 1.35 as determined from the GPC elution curve. On $^1$H-NMR analysis, the polymer was found to consist of Monomer 12, Monomer 3 and maleic anhydride in a molar ratio of 36:32:32.

Comparative Synthesis Example 3

Copolymerization of Monomers 1, 2 and 20

In a 500-ml flask, 19.6 g of Monomer 1, 28.9 g of Monomer 2, and 22.6 g of Monomer 20, all shown below, were dissolved in 100 ml of toluene. The system was fully purged of oxygen, charged with 0.38 g of the initiator AIBN, and heated at 60° C. at which polymerization reaction took place for 24 hours.

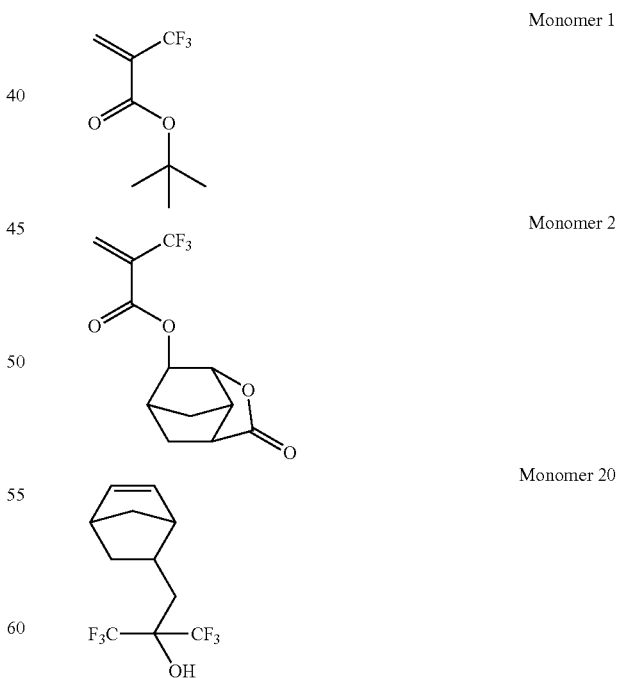

The polymer thus obtained was worked up by pouring the reaction mixture into hexane whereupon the polymer precipitated. The polymer collected was dissolved in tetrahydrofuran and poured into 2 liters of hexane for precipitation.

This cycle was repeated twice. The polymer was isolated and dried. There was obtained 46.1 g of a white polymer, which was found to have a Mw of 8,700 as measured by GPC, and a dispersity (Mw/Mn) of 1.4 as determined from the GPC elution curve. On $^1$H-NMR analysis, the polymer was found to consist of Monomer 1, Monomer 2 and Monomer 20 in a molar ratio of 45:23:32.

Resist Preparation and Exposure

Resist solutions were prepared in a conventional manner by formulating the polymer, photoacid generator (PAG1 to PAG3), basic compound, dissolution inhibitor (DRI1) and solvent (PGMEA) in the amounts shown in Table 1.

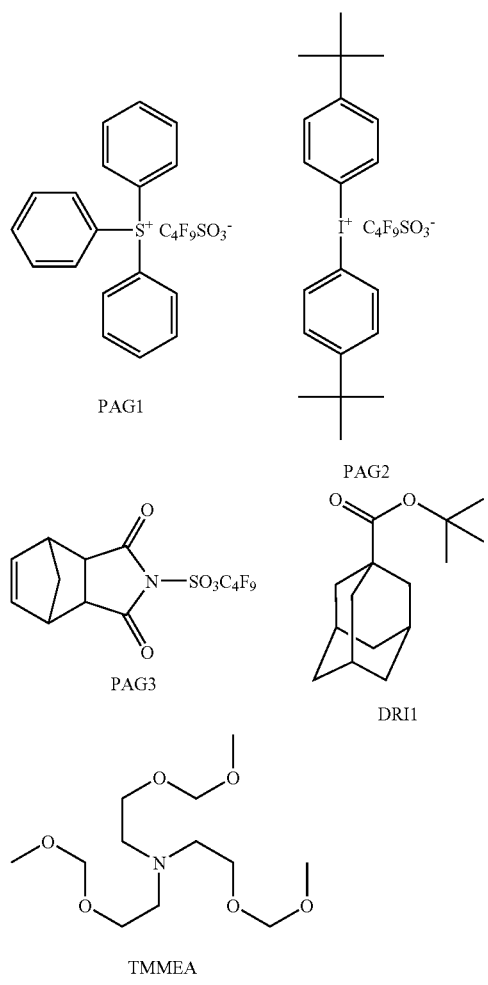

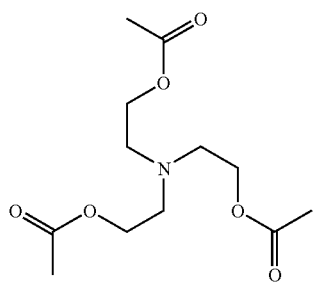

AAA

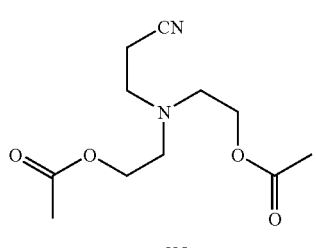

AACN

TEA: triethanolamine

PGMEA: propylene glycol monomethyl ether acetate

On silicon wafers having a film of DUV-30 (Brewer Science) coated to a thickness of 38 nm, the resist solutions were spin coated, then baked on a hot plate at 120° C. for 90 seconds to give resist films having a thickness of 200 nm.

The resist films were exposed by means of an ArF excimer laser scanner model NSR-S305B (Nikon Corp., NA 0.68, σ 0.85, ⅔ annular illumination, ordinary mask) while varying the exposure dose. Immediately after exposure, the resist films were baked at 120° C. for 90 seconds and then developed for 60 seconds with a 2.38% aqueous solution of tetramethylammonium hydroxide.

The exposure dose which provided a resolution to a 0.12-μm 1:1 line-and-space pattern was the optimum exposure dose (Eop), that is, a sensitivity (mJ/cm$^2$). The minimum line width (nm) of a 1:1 L/S pattern which was ascertained separate at this dose (Eop) was the resolution of a test resist. Using a measuring SEM model S-9220 (Hitachi Ltd.), the 0.12-μm 1:1 L/S pattern was measured for line edge roughness. The results are also shown in Table 1.

TABLE 1

| Polymer (pbw) | Photoacid generator (pbw) | Basic compound (pbw) | Dissolution inhibitor (pbw) | Solvent (pbw) | Sensitivity (mJ/cm$^2$) | Resolution (nm) | Line edge roughness (nm) |
|---|---|---|---|---|---|---|---|
| Synthesis Example 1 (100) | PAG1 (3) | TMMEA (0.4) | — | PGMEA (800) | 25 | 100 | 6.1 |
| Synthesis Example 2 (100) | PAG1 (3) | TMMEA (0.4) | — | PGMEA (800) | 26 | 100 | 6.5 |

TABLE 1-continued

| Polymer (pbw) | Photoacid generator (pbw) | Basic compound (pbw) | Dissolution inhibitor (pbw) | Solvent (pbw) | Sensitivity (mJ/cm$^2$) | Resolution (nm) | Line edge roughness (nm) |
|---|---|---|---|---|---|---|---|
| Synthesis Example 3 (100) | PAG1 (3) | TMMEA (0.4) | — | PGMEA (800) | 27 | 100 | 6.3 |
| Synthesis Example 4 (100) | PAG1 (3) | TMMEA (0.4) | — | PGMEA (800) | 21 | 100 | 6.2 |
| Synthesis Example 5 (100) | PAG1 (3) | TMMEA (0.4) | — | PGMEA (800) | 24 | 100 | 7.8 |
| Synthesis Example 6 (100) | PAG1 (3) | TMMEA (0.4) | — | PGMEA (800) | 23 | 100 | 7.5 |
| Synthesis Example 7 (100) | PAG1 (3) | TMMEA (0.4) | — | PGMEA (800) | 25 | 100 | 7.8 |
| Synthesis Example 8 (100) | PAG1 (3) | TMMEA (0.4) | — | PGMEA (800) | 23 | 100 | 7.5 |
| Synthesis Example 9 (100) | PAG1 (3) | TMMEA (0.4) | — | PGMEA (800) | 26 | 100 | 7.1 |
| Synthesis Example 10 (100) | PAG1 (3) | TMMEA (0.4) | — | PGMEA (800) | 24 | 100 | 7.3 |
| Synthesis Example 1 (100) | PAG2(4) PAG3(3) | TMMEA (0.2) | — | PGMEA (800) | 24 | 100 | 6.1 |
| Synthesis Example 1 (100) | PAG1 (3) | AAA (0.4) | — | PGMEA (800) | 30 | 100 | 6.2 |
| Synthesis Example 1 (100) | PAG1 (3) | AACN (0.4) | — | PGMEA (800) | 32 | 100 | 6.5 |
| Synthesis Example 4 (100) | PAG1 (3) | TMMEA (0.4) | DRI1 (10) | PGMEA (800) | 18 | 110 | 5.8 |
| Comparative Synthesis Example 1 (100) | PAG1 (3) | TEA (0.2) | — | PGMEA (800) | 31 | 100 | 8.9 |
| Comparative Synthesis Example 2 (100) | PAG1 (3) | TEA (0.2) | — | PGMEA (800) | 38 | 110 | 10.5 |
| Comparative Synthesis Example 3 (100) | PAG1 (3) | TEA (0.2) | — | PGMEA (800) | 22 | 100 | 7.6 |

Dry Etching Test

Each polymer, 2 g, was thoroughly dissolved in 10 g of PGMEA, and passed through a filter having a pore size of 0.2 μm, obtaining a polymer solution. The polymer solution was spin coated onto a silicon substrate and baked, forming a polymer film of 300 nm thick. Dry etching tests were carried out on the polymer films by etching them under two sets of conditions.

(1) CHF$_3$/CF$_4$ Gas Etching Test

Using a dry etching instrument TE-8500P (Tokyo Electron K.K.), the polymer film was etched with CHF$_3$/CF$_4$ gas under the following conditions. The difference in polymer film thickness before and after etching was determined.

| | |
|---|---|
| Chamber pressure | 40.0 Pa |
| RF power | 1000 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

(2) Cl$_2$/BCl$_3$ Gas Etching Test

Using a dry etching instrument L-507D-L (Nichiden Anerba K.K.), the polymer film was etched with Cl$_2$/BCl$_3$ gas under the following conditions. The difference in polymer film thickness before and after etching was determined.

| | |
|---|---|
| Chamber pressure | 40.0 Pa |
| RF power | 300 W |
| Gap | 9 mm |
| Cl$_2$ gas flow rate | 30 ml/min |

-continued

| | |
|---|---|
| BCl₃ gas flow rate | 30 ml/min |
| CHF₃ gas flow rate | 100 ml/min |
| O₂ gas flow rate | 2 ml/min |
| Time | 60 sec |

The results of the etching tests are shown in Table 2. In this evaluation, a less difference in polymer film thickness, i.e., a less film loss indicates more etching resistance.

TABLE 2

| Polymer | CHF₃/CF₄ gas etching rate (nm/sec) | Cl₂/BCl₃ gas etching rate (nm/sec) |
|---|---|---|
| Synthesis Example 1 | 150 | 149 |
| Synthesis Example 2 | 151 | 148 |
| Synthesis Example 3 | 150 | 144 |
| Synthesis Example 4 | 155 | 155 |
| Synthesis Example 5 | 128 | 130 |
| Synthesis Example 6 | 122 | 139 |
| Synthesis Example 7 | 126 | 132 |
| Synthesis Example 8 | 125 | 133 |
| Synthesis Example 9 | 125 | 135 |
| Synthesis Example 10 | 123 | 136 |
| Comparative Synthesis Example 1 | 142 | 155 |
| Comparative Synthesis Example 2 | 130 | 140 |
| Comparative Synthesis Example 3 | 156 | 170 |

Roughness Measurement

Using AFM (Digital Instruments, Model Nano-Scope 3A Dimension 5000), irregularities on the surface of the polymer film after CHF₃/CF₄ gas etching were measured. A root mean square (RMS) of AFM measurements was computed and reported as surface roughness. The results are shown in Table 3.

TABLE 3

| Polymer | Surface roughness (nm) after CHF₃/CF₄ gas etching |
|---|---|
| Synthesis Example 1 | 5.5 |
| Synthesis Example 2 | 5.7 |
| Synthesis Example 3 | 5.2 |
| Synthesis Example 4 | 5.8 |
| Synthesis Example 5 | 4.6 |
| Synthesis Example 6 | 4.1 |
| Synthesis Example 7 | 4.8 |
| Synthesis Example 8 | 4.5 |
| Synthesis Example 9 | 4.3 |
| Synthesis Example 10 | 3.8 |
| Comparative Synthesis Example 1 | 17.8 |
| Comparative Synthesis Example 2 | 14.6 |
| Comparative Synthesis Example 3 | 8.9 |

As is evident from Tables 1 to 3, resist compositions using inventive polymers, when processed through ArF exposure, demonstrate an excellent resolution, minimized line edge roughness, and good etching resistance, and especially minimized surface roughness after etching.

Japanese Patent Application No. 2004-023724 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formulae (1a), (1b) and (1c):

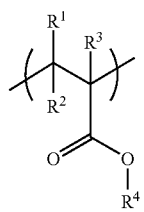
(1a)

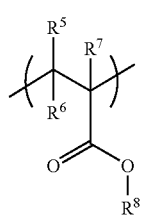
(1b)

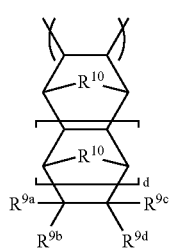
(1c)

wherein $R^1$, $R^2$, $R^5$, and $R^6$ each are a hydrogen or fluorine atom, $R^3$ and $R^7$ each are a fluorine atom or a straight, branched or cyclic fluoroalkyl group of 1 to 10 carbon atoms, $R^4$ is an acid labile group, $R^8$ is an adhesive group, d is 0, $R^{10}$ is a methylene group or an oxygen atom, and $R^{9a}$, $R^{9b}$, $R^{9c}$, and $R^{9d}$ each are hydrogen or alkyl groups which have adhesive groups and two of $R^{9a}$ to $R^{9d}$ may bond together to form a ring, with the proviso that all of $R^{9a}$ to $R^{9d}$ are not hydrogen atoms at the same time, the embodiments of $R^{9a}$, $R^{9b}$, $R^{9c}$, $R^{9d}$, and $R^{10}$ being selected so that the general formula (1c) is at least one member selected from the group consisting of the following specific formulae:

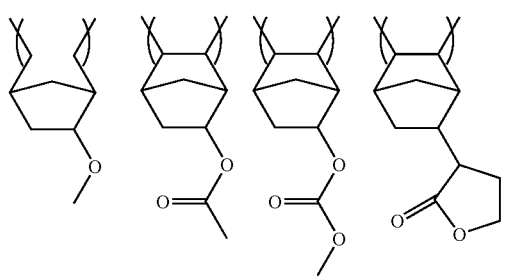

-continued

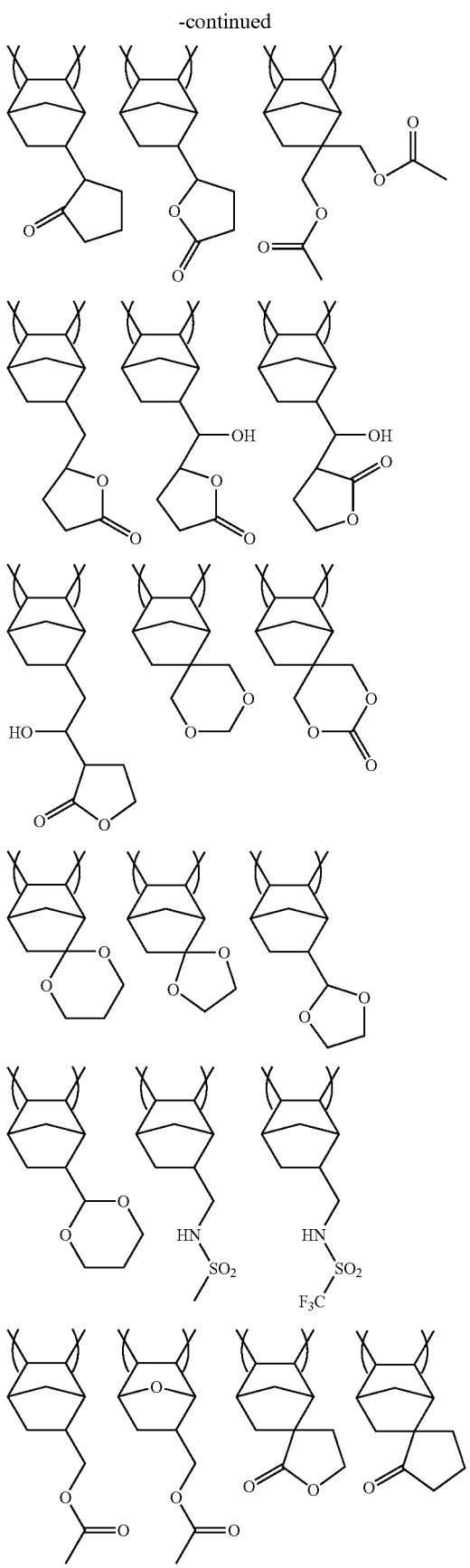

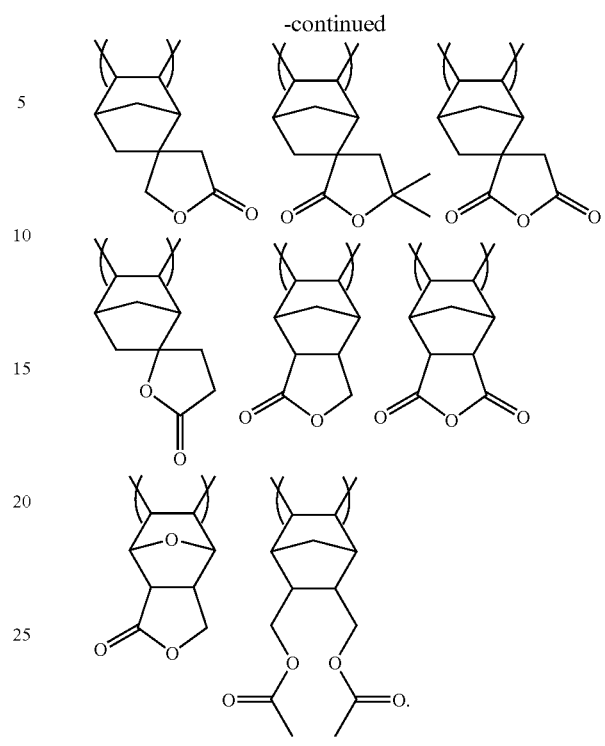

2. The polymer of claim 1, wherein $R^3$ and $R^7$ each are trifluoromethyl.

3. The polymer of claim 1, wherein the acid labile group represented by $R^4$ is at least one group selected from groups having the general formulae (2) to (4):

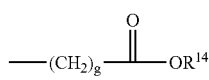 (2)

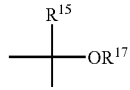 (3)

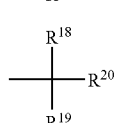 (4)

wherein $R^{14}$ and $R^{17}$ each are a monovalent hydrocarbon group of 1 to 20 carbon atoms, $R^{15}$ and $R^{16}$ each are hydrogen or a straight, branched or cyclic alkyl group of 1 to 20 carbon atoms, $R^{18}$ to $R^{20}$ each are a monovalent hydrocarbon group 1 to 20 carbon atoms in which some hydrogen atoms may be replaced by fluorine atoms, $R^{14}$ to $R^{20}$ may contain a heteroatom such as oxygen, sulfur, nitrogen or fluorine, a pair of $R^{15}$ and $R^{16}$, $R^{15}$ and $R^{17}$, $R^{16}$ and $R^{17}$, $R^{18}$ and $R^{19}$, $R^{18}$ and $R^{20}$, and $R^{19}$ and $R^{20}$ each may bond together to form a ring of 3 to 20 carbon atoms, especially 4 to 12 carbon atoms, with the carbon atom or the carbon and oxygen atoms with which they bond, said ring is monocyclic, heterocyclic or the like, and g is a number of 0 to 10.

4. The polymer of claim 1, wherein the adhesive group represented by $R^8$ is at least one group selected from the following list of groups:
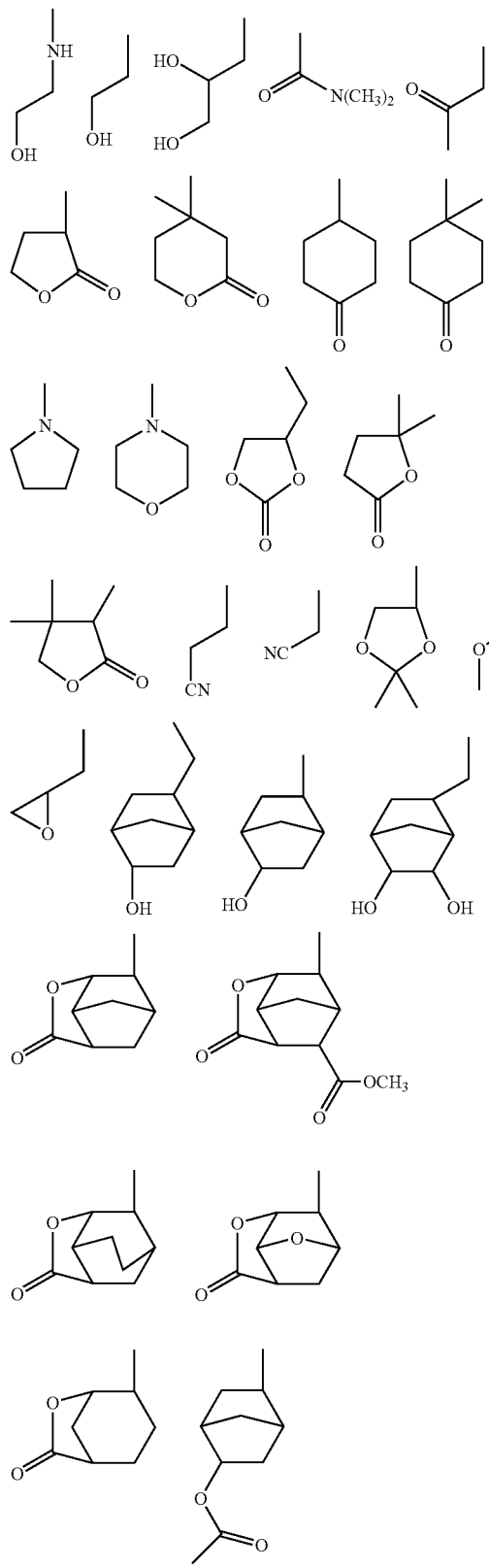
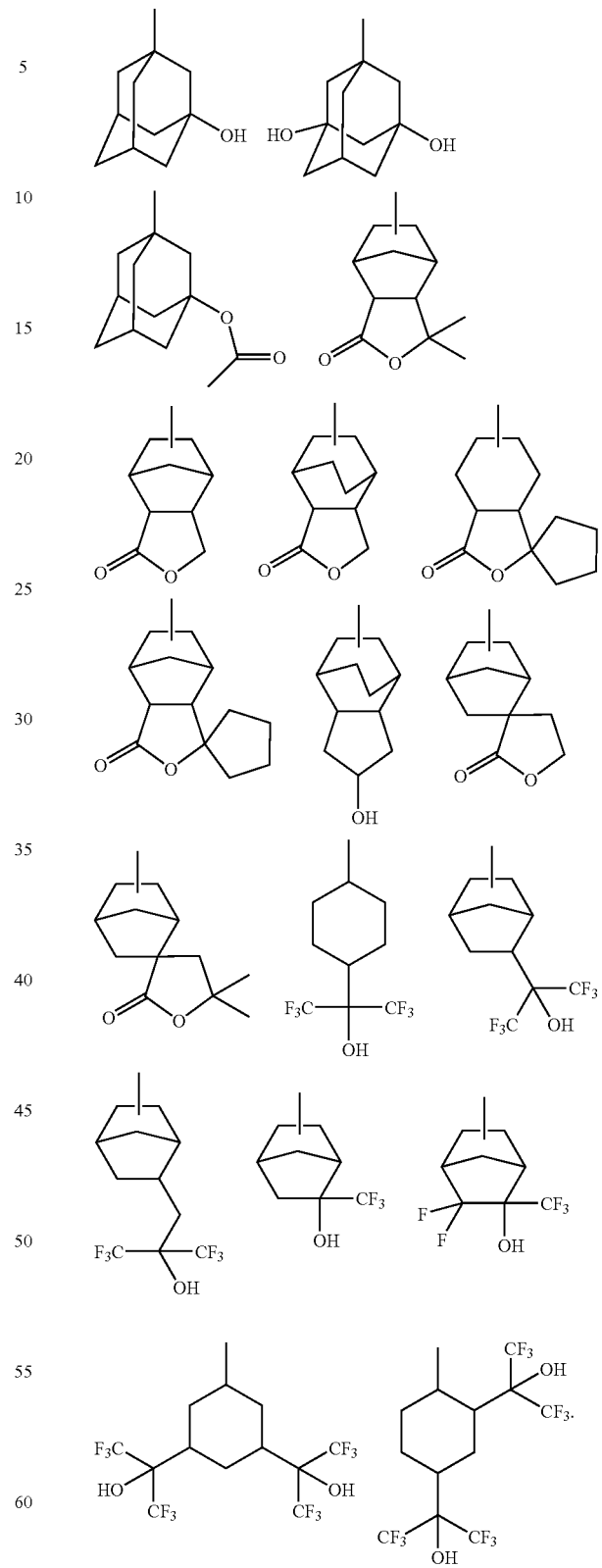
5. The polymer of claim 1, further comprising recurring units of at least one type selected from the following list of formula (1d):

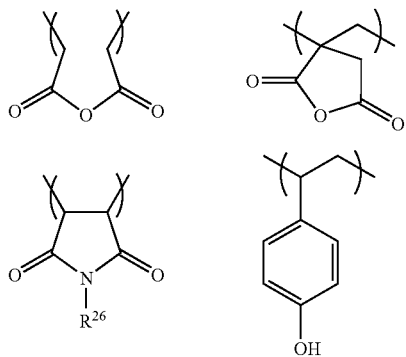

wherein R²⁶ is hydrogen, hydroxy or a straight, branched or cyclic alkyl group of 1 to 10 carbon atoms.

6. The polymer of claim 1, further comprising recurring units of at least one type selected from the following list of formula (1e):

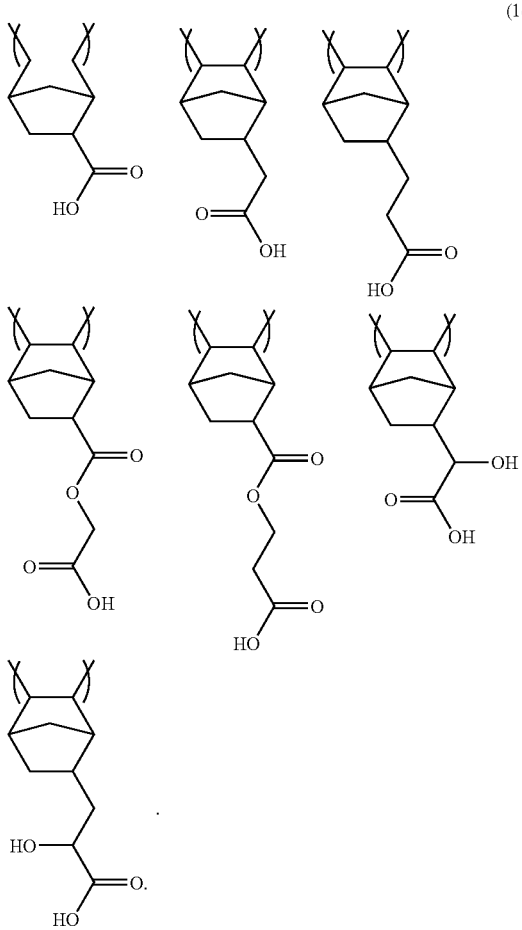

7. A resist composition comprising the polymer of claim 1.

8. chemically amplified positive resist composition comprising (A) the polymer of claim 1, (B) an organic solvent, and (C) a photoacid generator.

9. The resist composition of claim 8, further comprising (D) a basic compound.

10. The resist composition of claim 8, further comprising (E) a dissolution inhibitor.

11. A process for forming a pattern comprising the steps of:

applying the resist composition of claim 7 onto a substrate to form a coating, heat treating the coating and then exposing it to high-energy radiation having a wavelength of up to 200 nm through a photomask, and optionally heat treating the exposed coating and developing it with a developer.

12. The process of claim 11, wherein the high-energy radiation is an ArF excimer laser beam.

13. A chemically amplified positive resist composition comprising (A) the polymer of claim 1, (B) an organic solvent, (C) a photoacid generator, (D) a basic compound, and (E) a dissolution inhibitor.

14. A process for forming a pattern comprising the steps of:

applying the resist composition of claim 13 onto a substrate to form a coating, heat treating the coating and then exposing it to high-energy radiation having a wavelength of up to 200 nm through a photomask, and optionally heat treating the exposed coating and developing it with a developer.

15. The polymer of claim 1, comprising recurring units of monomers 1, 2, and 3:

Monomer 1

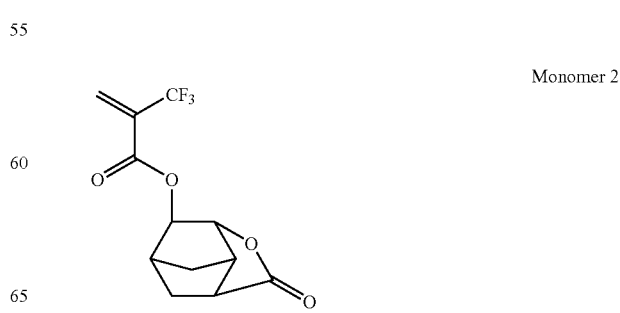

Monomer 2

-continued
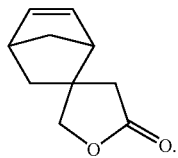
Monomer 3
16. The polymer of claim 1, comprising recurring units of
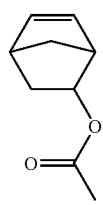
Monomer 7
-continued
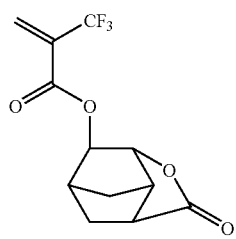
Monomer 2
Monomer 6
* * * * *